US011329156B2

(12) United States Patent
Mehrotra et al.

(10) Patent No.: US 11,329,156 B2
(45) Date of Patent: May 10, 2022

(54) TRANSISTOR WITH EXTENDED DRAIN REGION

(71) Applicant: NXP USA, INC., Austin, TX (US)

(72) Inventors: Saumitra Raj Mehrotra, Scottsdale, AZ (US); Ljubo Radic, Gilbert, AZ (US); Bernhard Grote, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/715,396

(22) Filed: Dec. 16, 2019

(65) Prior Publication Data

US 2021/0184034 A1 Jun. 17, 2021

(51) Int. Cl.
| | |
|---|---|
| *H01L 29/78* | (2006.01) |
| *H01L 29/423* | (2006.01) |
| *H01L 29/40* | (2006.01) |
| *H01L 29/10* | (2006.01) |
| *H01L 29/08* | (2006.01) |
| *H01L 29/66* | (2006.01) |
| *H01L 21/3213* | (2006.01) |

(Continued)

(52) U.S. Cl.
CPC .... *H01L 29/7825* (2013.01); *H01L 21/32137* (2013.01); *H01L 29/0865* (2013.01); *H01L 29/0882* (2013.01); *H01L 29/1033* (2013.01); *H01L 29/404* (2013.01); *H01L 29/407* (2013.01); *H01L 29/4236* (2013.01); *H01L 29/6656* (2013.01); *H01L 29/66704* (2013.01); *H01L 21/26513* (2013.01); *H01L 29/0688* (2013.01); *H01L 29/1095* (2013.01); *H01L 29/456* (2013.01); *H01L 29/665* (2013.01)

(58) Field of Classification Search
CPC ............. H01L 29/7825; H01L 29/0865; H01L 29/404; H01L 29/0882; H01L 21/32137; H01L 29/66704; H01L 29/6656; H01L 29/4236; H01L 29/1033; H01L 29/407; H01L 29/1095; H01L 21/26513; H01L 29/0688; H01L 29/456; H01L 29/665
See application file for complete search history.

(56) References Cited

U.S. PATENT DOCUMENTS

| | | | |
|---|---|---|---|
| 4,553,151 A | 11/1985 | Schutten et al. | |
| 4,893,160 A | 1/1990 | Blanchard | |

(Continued)

FOREIGN PATENT DOCUMENTS

WO 2005093841 A2 10/2005

OTHER PUBLICATIONS

Notice of Allowance dated Aug. 21, 2020 in U.S. Appl. No. 16/171,830.

(Continued)

*Primary Examiner* — Mohammed R Alam
(74) *Attorney, Agent, or Firm* — David G. Dolezal

(57) ABSTRACT

A transistor device having a channel region including a portion located in a sidewall of semiconductor material of a trench and an extended drain region including a portion located in a lower portion of the semiconductor material of the trench. In one embodiment, a control terminal of the transistor device is formed by patterning a layer of control terminal material to form a sidewall in the trench and a field plate for the transistor device is formed by forming a conductive sidewall spacer structure along the sidewall of the control terminal material.

11 Claims, 12 Drawing Sheets

(51) Int. Cl.
  *H01L 29/45* (2006.01)
  *H01L 21/265* (2006.01)
  *H01L 29/06* (2006.01)

(56) References Cited

U.S. PATENT DOCUMENTS

| | | |
|---|---|---|
| 5,316,959 A | 5/1994 | Kwan et al. |
| 5,324,683 A | 6/1994 | Fitch et al. |
| 5,407,860 A | 4/1995 | Stoltz et al. |
| 5,434,435 A | 7/1995 | Baliga |
| 5,723,891 A | 3/1998 | Malhi |
| 5,736,446 A | 4/1998 | Wu et al. |
| 5,770,507 A | 6/1998 | Chen et al. |
| 5,869,379 A | 2/1999 | Gardner et al. |
| 5,914,519 A | 6/1999 | Chou et al. |
| 6,064,107 A | 5/2000 | Yeh et al. |
| 6,277,700 B1 | 8/2001 | Yu et al. |
| 6,858,500 B2 | 2/2005 | Sugi et al. |
| 6,861,332 B2 | 3/2005 | Park et al. |
| 6,864,135 B2 | 3/2005 | Grudowski et al. |
| 6,946,348 B2 | 9/2005 | Zeng |
| 7,368,785 B2 | 5/2008 | Chen et al. |
| 7,400,024 B2 | 7/2008 | Kunnen |
| 7,576,388 B1 | 8/2009 | Wilson et al. |
| 7,579,650 B2 | 8/2009 | Cao et al. |
| 7,709,889 B2 | 5/2010 | Moens et al. |
| 7,759,206 B2 | 7/2010 | Luo et al. |
| 7,800,167 B2 | 9/2010 | Kitamura et al. |
| 7,893,488 B2 | 2/2011 | Hebert |
| 7,923,776 B2 | 4/2011 | Yilmaz et al. |
| 8,043,913 B2 | 10/2011 | Yilmaz et al. |
| 8,304,312 B2 | 11/2012 | Hebert |
| 8,319,278 B1 | 11/2012 | Zeng et al. |
| 8,329,538 B2 | 12/2012 | Pan et al. |
| 8,502,287 B2 | 8/2013 | Radic et al. |
| 8,647,950 B2 | 2/2014 | Zuniga et al. |
| 8,716,794 B2 | 5/2014 | Luo et al. |
| 8,742,495 B2 | 6/2014 | Parthasarathy et al. |
| 8,981,470 B2 | 3/2015 | Nozu |
| 9,171,931 B2 | 10/2015 | Ng et al. |
| 9,559,198 B2 | 1/2017 | Stefanov et al. |
| 9,620,583 B2 | 4/2017 | Kelkar et al. |
| 10,103,257 B1 | 10/2018 | Qin et al. |
| 10,424,646 B2 | 9/2019 | Mehrotra et al. |
| 10,600,911 B2 | 3/2020 | Grote et al. |
| 2004/0021233 A1 | 2/2004 | Kinzer et al. |
| 2006/0001084 A1 | 1/2006 | Kelly et al. |
| 2006/0017078 A1 | 1/2006 | Thapar |
| 2006/0209586 A1 | 9/2006 | Hirler |
| 2007/0274110 A1 | 11/2007 | Kitamura et al. |
| 2009/0256212 A1 | 10/2009 | Denison et al. |
| 2010/0006929 A1 | 1/2010 | Andou |
| 2010/0015770 A1 | 1/2010 | Tai et al. |
| 2010/0244125 A1 | 9/2010 | Sonsky et al. |
| 2013/0105888 A1* | 5/2013 | Zuniga ............ H01L 29/66704 257/330 |
| 2013/0181723 A1 | 7/2013 | Mauder et al. |
| 2013/0334565 A1 | 12/2013 | Hutzler et al. |
| 2014/0021534 A1 | 1/2014 | Verma et al. |
| 2014/0097492 A1 | 4/2014 | Yu |
| 2014/0138739 A1 | 5/2014 | Magri et al. |
| 2014/0225186 A1 | 8/2014 | Abou-Khalil et al. |
| 2015/0084123 A1 | 3/2015 | Kawashiri et al. |
| 2015/0137223 A1 | 5/2015 | Siemieniec et al. |
| 2015/0380348 A1 | 12/2015 | Noebauer et al. |
| 2015/0380538 A1 | 12/2015 | Ogawa |
| 2016/0020315 A1 | 1/2016 | Hirler |
| 2016/0211348 A1 | 7/2016 | Yoshida |
| 2016/0268423 A1* | 9/2016 | Koepp ............... H01L 29/4236 |
| 2016/0359029 A1 | 12/2016 | Zeng et al. |
| 2017/0263767 A1 | 9/2017 | Nishiwaki |
| 2017/0338337 A1 | 11/2017 | Bobde et al. |
| 2018/0006026 A1 | 1/2018 | Lui |
| 2018/0006109 A1 | 1/2018 | Mauder et al. |
| 2018/0099490 A1 | 3/2018 | Lin et al. |
| 2019/0097045 A1 | 3/2019 | Grote et al. |
| 2019/0097046 A1 | 3/2019 | Mehrotra et al. |
| 2019/0206987 A1 | 7/2019 | Adachi et al. |
| 2019/0280094 A1 | 9/2019 | Grote et al. |

OTHER PUBLICATIONS

U.S. Appl. No. 17/139,820, filed Dec. 31, 2020, entitled "Transistor Devices With Termination Regions".
Notice of Allowance dated Jun. 24, 2020 in U.S. Appl. No. 16/205,461.
Notice of Allowance dated Apr. 21, 2021 in U.S. Appl. No. 16/836,293.
Notice of Allowance dated Feb. 4, 2020 in U.S. Appl. No. 15/918,563.
Cha, H., "0.18um 100V-rated BCD with Large Area Power LDMOS with ultra-low effective Specific Resistance", IEEE 2016.
Cheng, K., "Air Spacer for 10nm FinFET CMOS and Beyond", IEEE 2016.
Chil, M., "Advanced 300mm 130NM BCD technology from 5V to 85V with Deep-Trench Isolation", IEEE 2016.
Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.
Huang, T., "0.18um BCD Technology with Best-in-Class LDMOS from 6 V to 45 V", Proceedings of the 26th International Symposium on Power Semiconductor Devices & IC's, Jun. 15-19, 2014.
Kumar, M., "Extended-p+ Stepped Gate LDMOS for Improved Performance", IEEE Transactions on Electron Devices, vol. 57, No. 7, Jul. 2010.
Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.
Takaya, H., "Floating Island and Thick Bottom Oxide Trench Gate MOSFET (FITMOS)—A 60V Ultra Low On-Resistance Novel MOSFET with Superior Internal Body Diode-", Proceedings of the 17th International Symposium on Power Semiconductor Devices & IC's, May 23-26, 2005.
Yang, H., "Low-Leakage SMARTMOS 10W Technology at 0.13um Node with Optimized Analog, Power and Logic Devices for SOC Design", IEEE 2008.
Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa, 2013.
Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.
U.S. Appl. No. 16/141,674, filed Sep. 25, 2018, entitled "Transistor Devices With Control-Terminal Field Plate Structures in Trenches".
U.S. Appl. No. 16/171,830, filed Oct. 26, 2018, entitled "Transistor Devices With Extended Drain Regions Located in Trench Sidewalls".
U.S. Appl. No. 16/174,955, filed Oct. 30, 2018, entitled "Vertical Transistor With Extended Drain Region".
U.S. Appl. No. 16/205,461, filed Nov. 30, 2018, entitled "Transistor With Gate/Field Plate Structure".
Non-final office action dated Oct. 15, 2018 in U.S. Appl. No. 15/715,816.
Non-final office action dated Nov. 16, 2018 in U.S. Appl. No. 15/715,852.
Non-final office action dated Feb. 21, 2019 in U.S. Appl. No. 15/715,816.
Ex-Parte Quayle action dated Mar. 5, 2019 in U.S. Appl. No. 15/715,852.
Non-final office action dated Apr. 9, 2019 in U.S. Appl. No. 15/715,831.
Ex-Parte Quayle action dated Apr. 24, 2019 in U.S. Appl. No. 15/715,852.
Final office action dated Jun. 7, 2019 in U.S. Appl. No. 15/715,816.

(56) References Cited

OTHER PUBLICATIONS

Notice of Allowance dated Jul. 9, 2019 in U.S. Appl. No. 15/715,852.
Final office action dated Jul. 18, 2019 in U.S. Appl. No. 15/715,831.
Non-final office action dated Jul. 25, 2019 in U.S. Appl. No. 15/918,563.
Non-final office action dated Aug. 8, 2019 in U.S. Appl. No. 15/715,816.
Notice of Allowance dated Sep. 25, 2019 in U.S. Appl. No. 15/715,831.
Final office action dated Nov. 19, 2019 in U.S. Appl. No. 15/715,816.
U.S. Appl. No. 16/692,517, filed Nov. 22, 2019, entitled "Transistor Formed With Spacer".
U.S. Appl. No. 16/836,293, filed Mar. 31, 2020, entitled Transistor Trench With Field Plate Structure.
U.S. Appl. No. 16/836,344, filed Mar. 31, 2020, entitled Trench With Different Transverse Cross-Sectional Widths.
Notice of Allowance dated Apr. 21, 2020 in U.S. Appl. No. 16/174,955.
Non-final office action dated May 4, 2020 in U.S. Appl. No. 16/171,830.
Qiao, M., "A Novel Substrate-Assisted RESURF Technology for Small Curvature Radius Junction", Proceedings of the 23rd International Symposium on Power Semiconductor Devices & IC's, May 23-26, 2011.
Non-final office action dated Apr. 14, 2021 in U.S. Appl. No. 16/836,344.
Ex-Parte Quayle dated Jan. 7, 2020 in U.S. Appl. No. 16/174,955.
Notice of Allowance dated Jan. 21, 2020 in U.S. Appl. No. 15/715,816.
Non-final office action dated May 12, 2021 in U.S. Appl. No. 16/141,674.
Non-final office action dated Oct. 29, 2021 in U.S. Appl. No. 16/692,517.
Notice of Allowance dated Sep. 27, 2021 in U.S. Appl. No. 16/836,344.
Notice of Allowance dated Mar. 14, 2022 in U.S. Appl. No. 16/692,517.

* cited by examiner

TRANSISTOR WITH EXTENDED DRAIN REGION

BACKGROUND OF THE INVENTION

Field of the Invention

This invention relates in general to transistor devices and more specifically to transistor devices with extended drain regions.

Background

Some types of transistors such as power transistors, high voltage devices, and RF devices (e.g. laterally diffused metal oxide semiconductor (LDMOS), drain extended MOS (DEMOS)) include extended drain regions located in a carrier path between the drain region and the channel region. An extended drain region of a transistor has the same net conductivity type as the drain region of the transistor. An extended drain region may provide a transistor with a higher breakdown voltage in that most of the voltage applied to the drain region is dropped across the drift region of the extended drain region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein are embodiments of a transistor device having a channel region including a portion located in a sidewall of semiconductor material of a trench and an extended drain region including a portion located in a lower portion of the semiconductor material of the trench. In one embodiment, a control terminal of the transistor device is formed by patterning a layer of control terminal material to form a sidewall in the trench and a field plate for the transistor device is formed by forming a conductive sidewall spacer structure along the sidewall of the control terminal material.

One advantage of at least some embodiments of such a transistor device is that the transistor occupies less area of the device in that the channel region is vertical and yet the device is scalable in that a portion of the extended drain region is horizontally oriented to allow for varying the length of the extended drain region to adjust the desired breakdown voltage. Another advantage in some embodiments is that the field plate structure can be formed without the use of a photolithographic mask.

FIGS. 1-9 set forth partial cutaway side views of various stages of a wafer in the manufacture of a transistor device according to one embodiment of the present invention.

Figure 1:
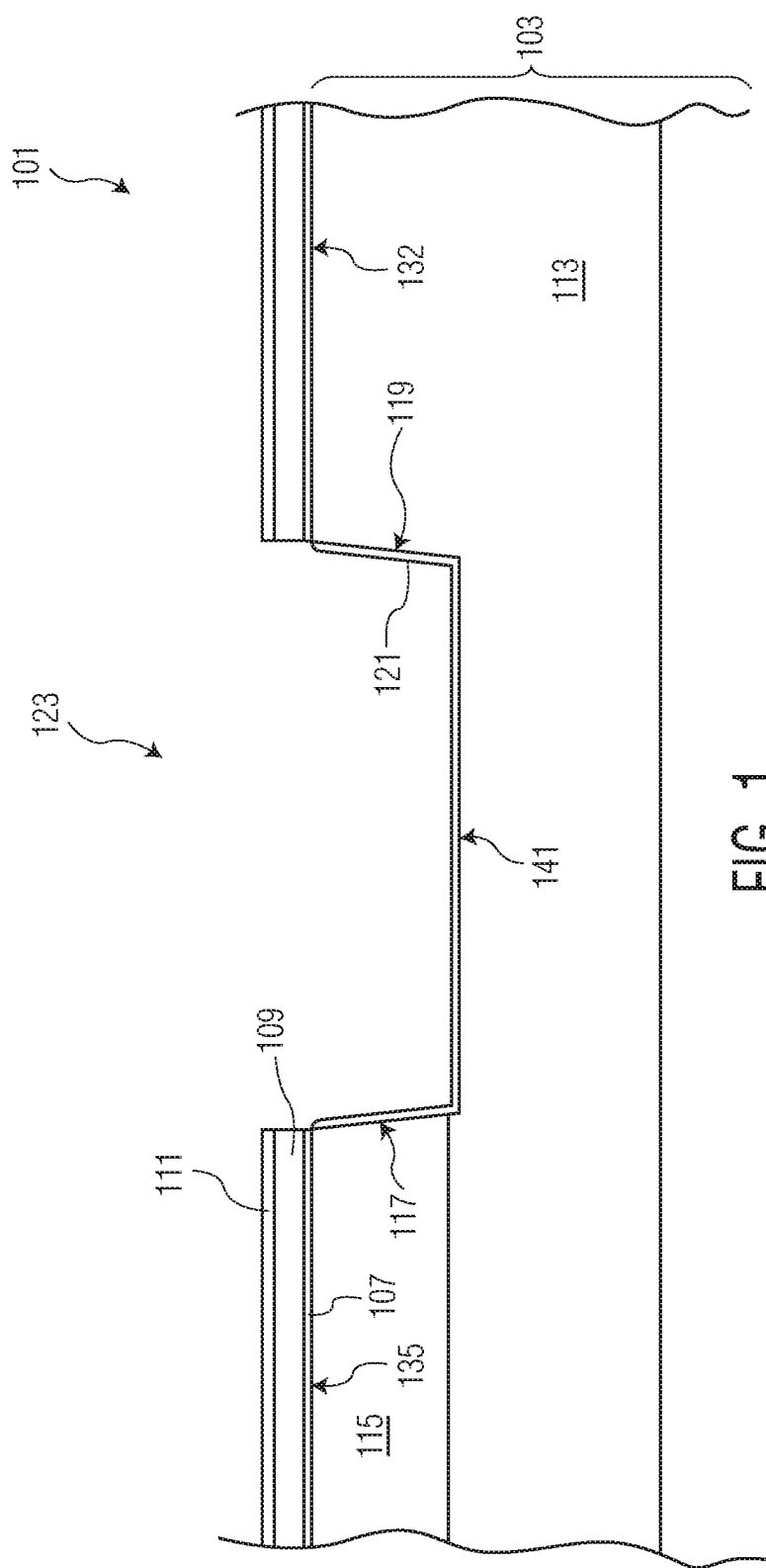
FIGS. 1-9 set forth partial cutaway side views of various stages in the manufacture of a transistor device according to one embodiment of the present invention.

FIG. 1 is a partial cutaway side view showing a portion of wafer 101 with a trench 123 formed therein. In one embodiment, wafer 101 includes a substrate 103 of semiconductor material. In one embodiment, substrate 103 has a net P-type conductivity doping. In one embodiment, substrate 103 is doped with boron and has a net P-type conductivity dopant concentration of about $2e15/cm^3$, but may be doped with other types of dopants and/or may be at other concentrations in other embodiments. In one embodiment, substrate 103 is made of monocrystalline silicon, but may be made of other semiconductor materials (e.g. silicon germanium, germanium, silicon carbide, gallium nitride, gallium arsenide, other semiconductor III-V materials) in other embodiments. In yet another embodiment, substrate 103 may be a semiconductor-on-insulator (SOI) substrate where the trenches are formed in the semiconductor layer located above an insulator layer (not shown). In other embodiments, substrate 103 may be made of layers of different semiconductor material and/or include other regions (not shown) of different conductivity types (e.g. a buried N-type region).

Substrate 103 includes a region 113 implanted with N-type dopants. In one embodiment, region 113 is implanted with phosphorous dopants at an energy of 100-1000 keV and at a dosage of $1e11-1e13/cm^2$, but may be implanted with other types of dopants, at other energies, and at other dosages in other embodiments. In one embodiment, region 113 can be part of a N-type epi growth region with a doping concentration $1e16-1e18/cm^3$. In one embodiment, after implantation, wafer 101 is annealed where the dopants diffuse to the location of region 113 shown in FIG. 1. After diffusion, the dopants have a desired concentration for extended drain regions for subsequently formed transistors.

In FIG. 1, wafer 101 includes a P-well region 115 located above region 113 in substrate 103. In one embodiment, P-well region 115 is formed by implanting P-type dopants into a top portion of substrate 103. In one embodiment, the P-type dopants are boron and are implanted at an energy a 20-200 keV and at a dosage of $1e11-1e13/cm^2$, but may include other types of dopants, implanted at other energies, and at other doping concentrations in other embodiments. In one embodiment, after implantation of the P-type dopants, wafer 101 is annealed where the dopants diffuse to the location of P-well region 115 as shown in FIG. 1. In one embodiment, the dopant concentration of well region 115 is sufficient for a portion of well region 115 to act as a channel region of a subsequently formed transistor.

After the implantation of the N-type and P-type dopants, a pad oxide layer 107, nitride layer 109, and oxide layer 111 are formed on substrate 103. Afterwards, a trench 123 is formed in wafer 101. The formation of trench 123 forms sidewalls 117 and 119 in substrate 103 as well as upper surface levels 135 and 137 and lower surface level 141. In one embodiment, trench 123 is formed by forming a patterned mask (not shown) on wafer 101 and then anisotropically etching layers 111, 109, 107, and substrate 103 as per the pattern with the appropriate etch chemistries. In other embodiments, other types of hard mask layers may be utilized in forming trench 123. In one embodiment, trench 123 has a width of 2.0 μm and a depth of 0.3 μm, but may have other widths and/or depths in other embodiments.

After the formation of trench 123, a gate dielectric layer 121 is formed on the sidewalls 117 and 121 and the lower surface level 141 of trench 123. In one embodiment, gate dielectric layer 121 has a thickness of 100 A and is formed by an oxidation process, but may be of other thicknesses, of other dielectric materials, and/or formed by other methods in other embodiments.

Figure 2:
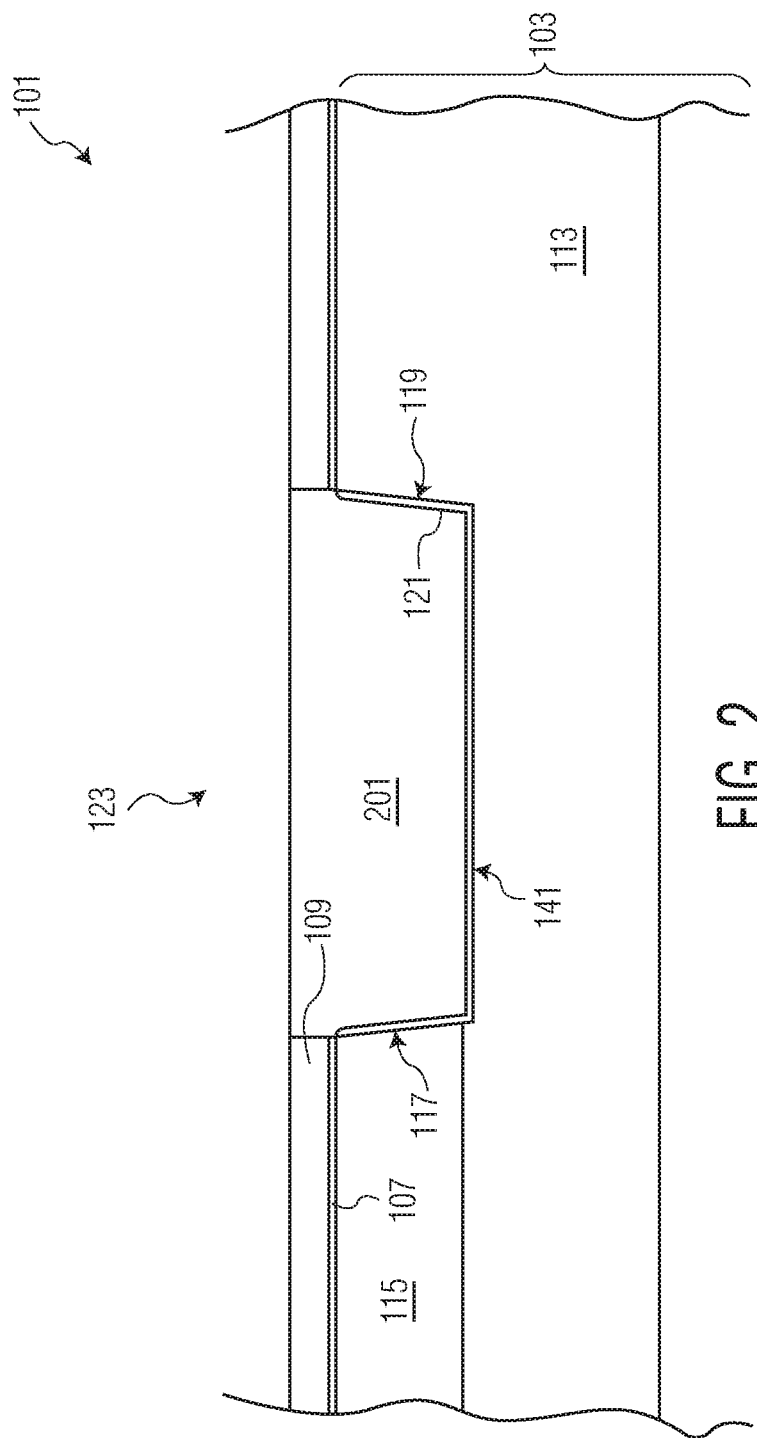

FIG. 2 is a partial cutaway side view of wafer 101 after gate material structure 201 is formed in trench 123. In one embodiment, structure 201 is formed of polysilicon, but may be formed of other conductive materials in other embodiments. In one embodiment, structure 201 is formed by forming a layer of polysilicon over wafer 101 (e.g. by a deposition process) and then planarizing wafer 101 (e.g. by CMP process) where nitride layer 109 is used as a planarization stop. In some embodiments, wafer 101 is not planarized after the layer of gate material is formed on wafer 101.

Figure 3:
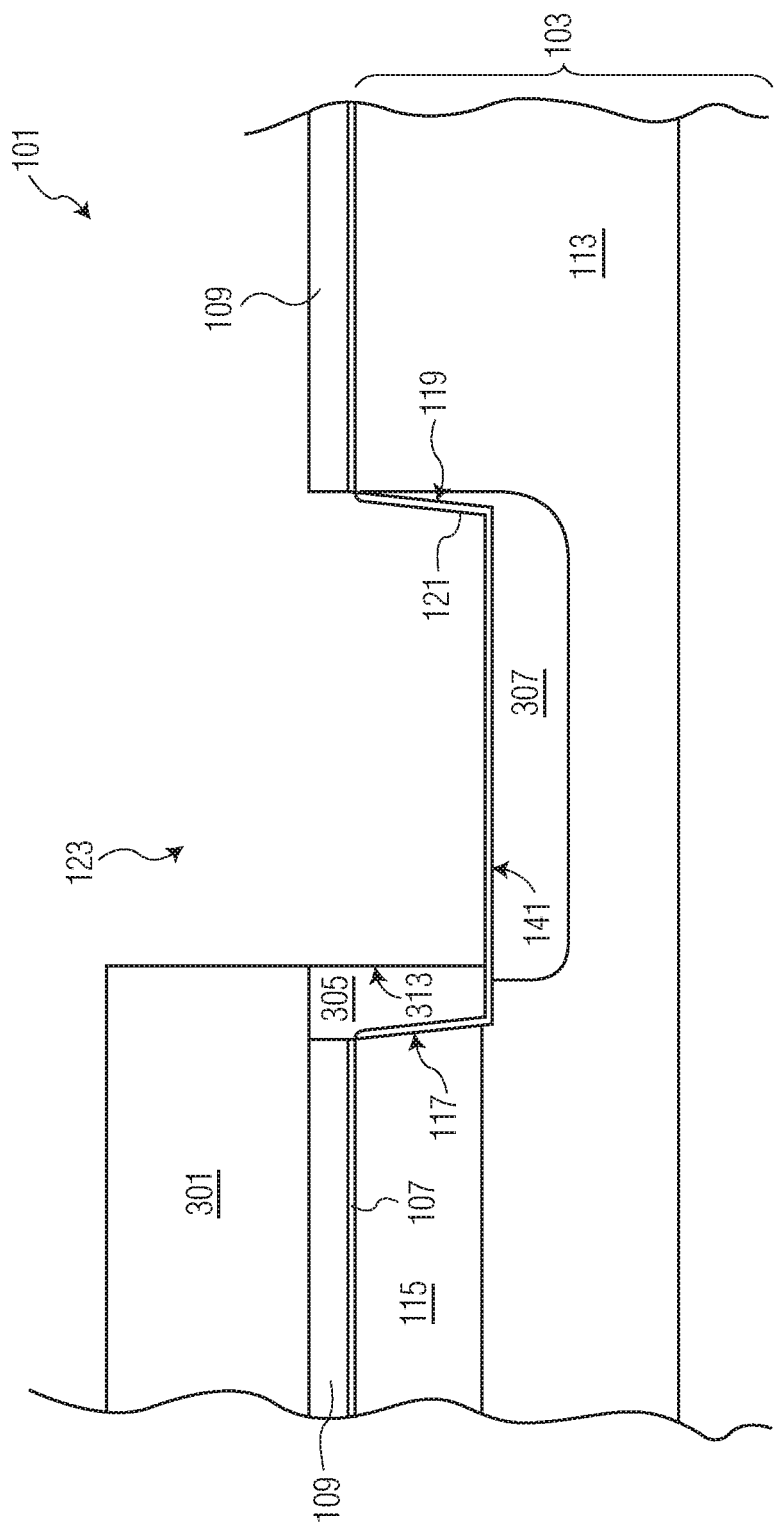

Referring to FIG. 3, structure 201 is patterned with mask 301 to form a gate structure 305 in trench 123. In one embodiment mask 301 is made of a layer of oxide that is deposited on wafer 101 and etched to form side wall 313. In one embodiment, mask 301 is 1 micron thick, but may be formed of other materials and have other thickness in other embodiments. Gate structure 305 will be utilized as a gate (a control terminal for field effect transistor) for a subsequently formed transistor.

After the formation of structure 305, a self-aligned drift implant is made into region 113 to form doped drift region 307. In one embodiment, region 307 is selectively implanted with N-type dopants (e.g. arsenic, phosphorous) at a concentration of 5e12/cm$^2$, and an energy of 40 Kev. However, region 307 may be implanted at other energies and/or other concentrations in other embodiments. Oxide mask 301 and nitride layer 109 are used as implant masks. A portion of the dopants are implanted into sidewall 119. Some embodiments do not include region 307.

Figure 4:
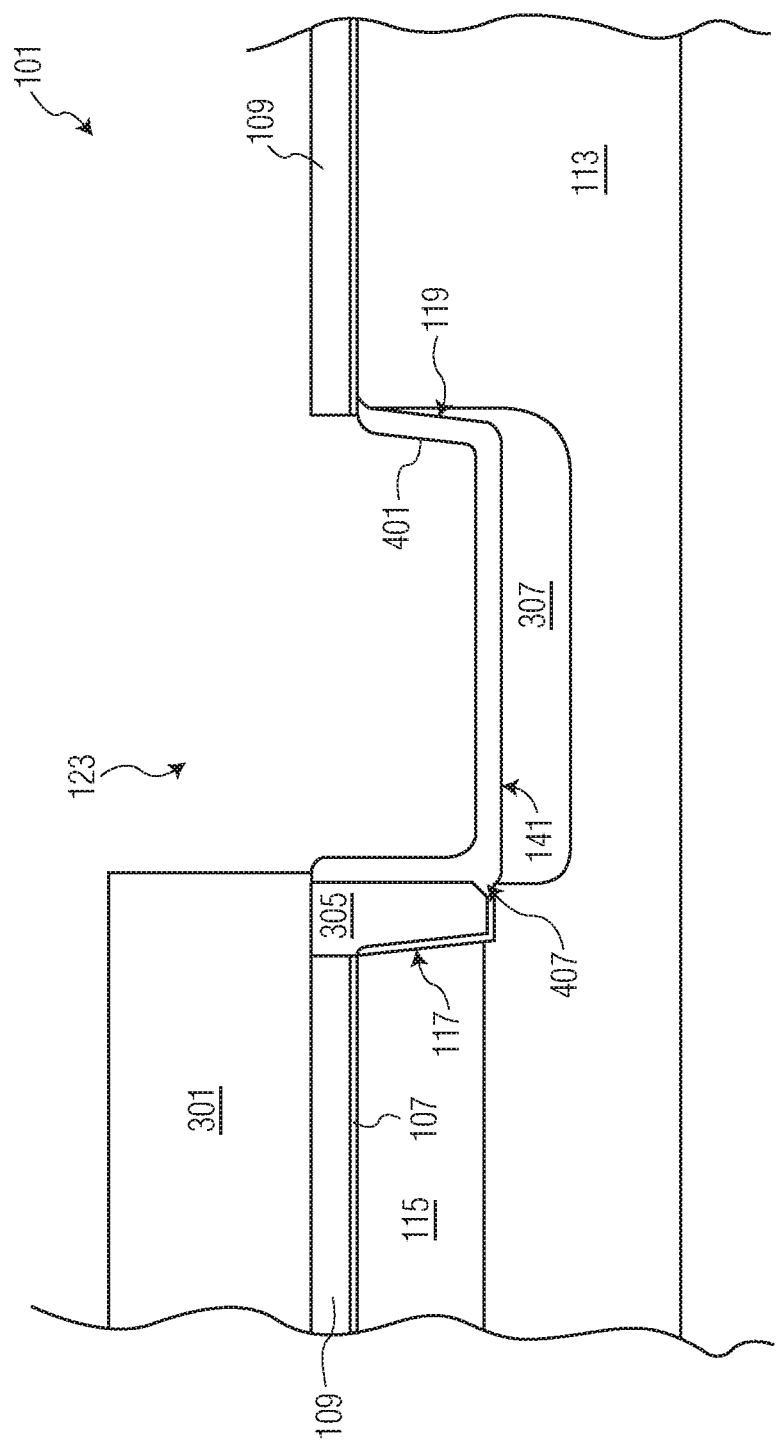

Referring to FIG. 4, after the formation of structure 305, a layer 401 of oxide is formed in trench 123. In one embodiment, layer 401 is formed by an oxidation process, but may be formed by a deposition process and/or be made of other dielectric materials in other embodiments. In one embodiment, layer 401 has a thickness of 10 nm but may have other thicknesses in other embodiments.

In one embodiment, layer 401 is formed by a LOCOS (local oxidation of silicon). As part of the LOCOS process, a portion of structure 305 is oxidized. Layer 121 on lower surface level 141 and sidewall 119 thickens (the increase in thickness of layer 121 is shown as layer 401 in FIG. 4). As part of the LOCOS process, a bird's beak of oxide (407) forms beneath an edge of structure 305. As will be described later, this bird's beak of oxide at the corner of gate structure 305 acts to spread out the electrostatic fields in the extended drain regions during operation. Although some embodiments may not include the bird's beak.

Figure 5:
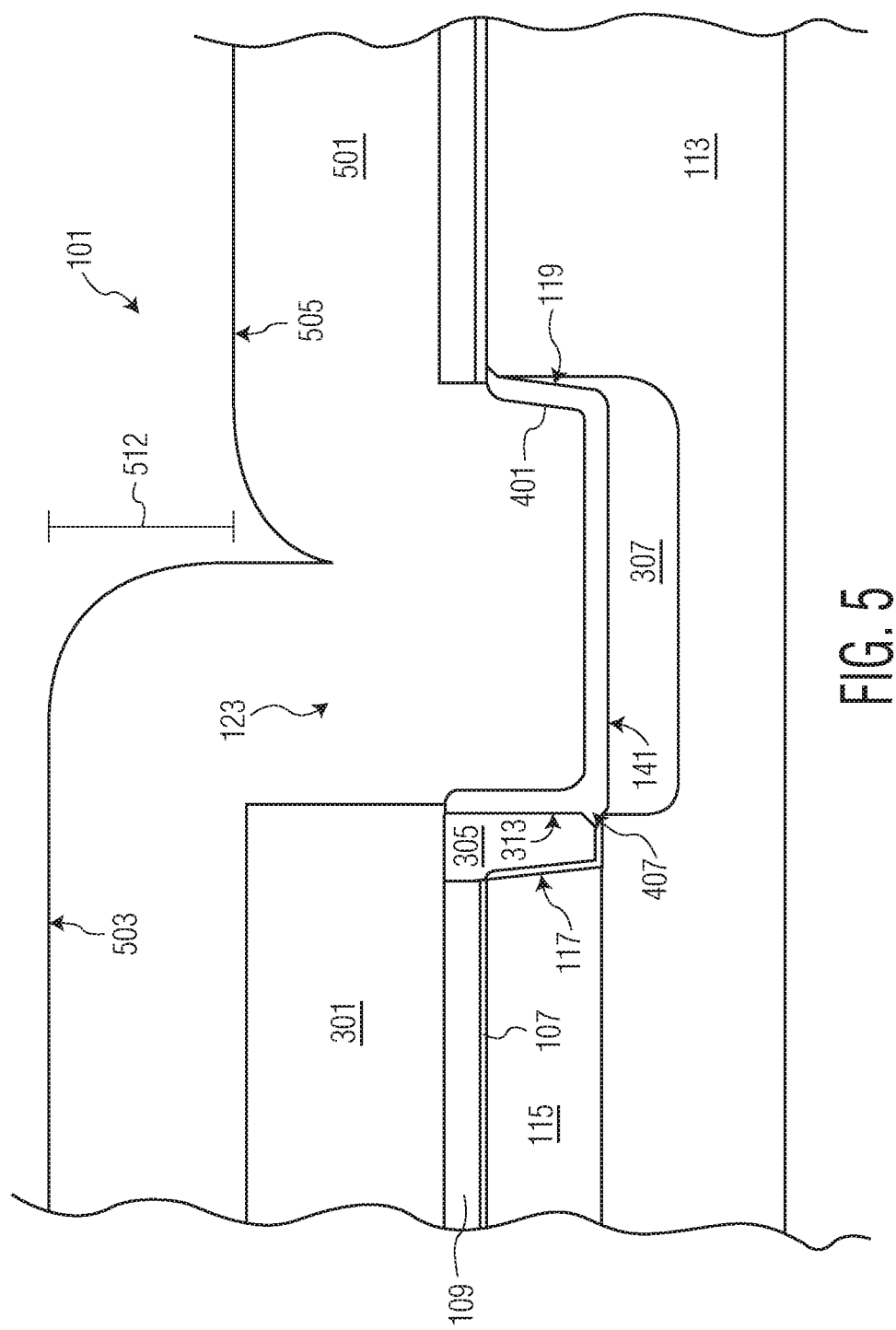

FIG. 5 shows a partial cutaway side view of wafer 101 after a layer 501 of conductive spacer material is formed over wafer 101. In one embodiment, layer 501 is made of polysilicon, but may be made of other conductive materials in other embodiments. In one embodiment, layer 501 has a thickness of 0.1 μm, but may be of other thicknesses in other embodiments. In the embodiment shown, the top surface 503 of layer 501 located directly over sidewall 313 is higher than the top surface 505 of layer 501 located directly over sidewall 119 by a distance 512 that is greater than the depth of trench 123.

Figure 6:
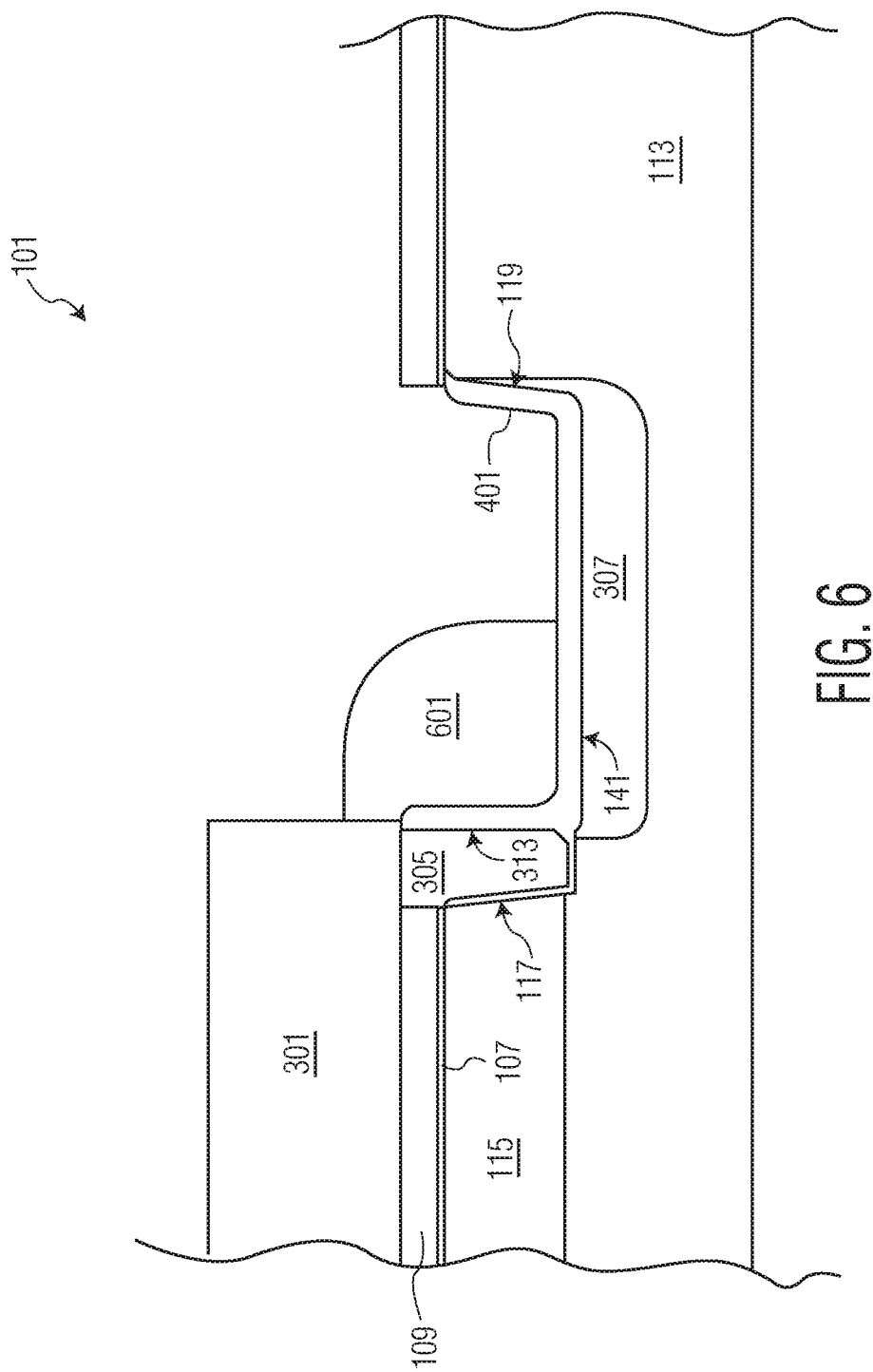

FIG. 6 is a partial cutaway side view of wafer 101 after a conductive sidewall spacer structure 601 formed laterally adjacent to gate structure 305 along sidewall 113 by the anisotropic etching of layer 501. In one embodiment where layer 501 is made of polysilicon, layer 501 is etched with a plasma etch. In the embodiment shown, spacer structure 601 has a height such that it extends above layer 109.

As shown in FIG. 6, after the anisotropic etching, no sidewall spacer remains along sidewall 119 on the opposite side of the trench. In some embodiments, this is due to the fact that oxide mask 301 has a greater height than nitride layer 109. Hence, as a result of the anisotropic etching, a spacer structure located along sidewall 119 is etch away while spacer structure 601 remains.

Figure 7:
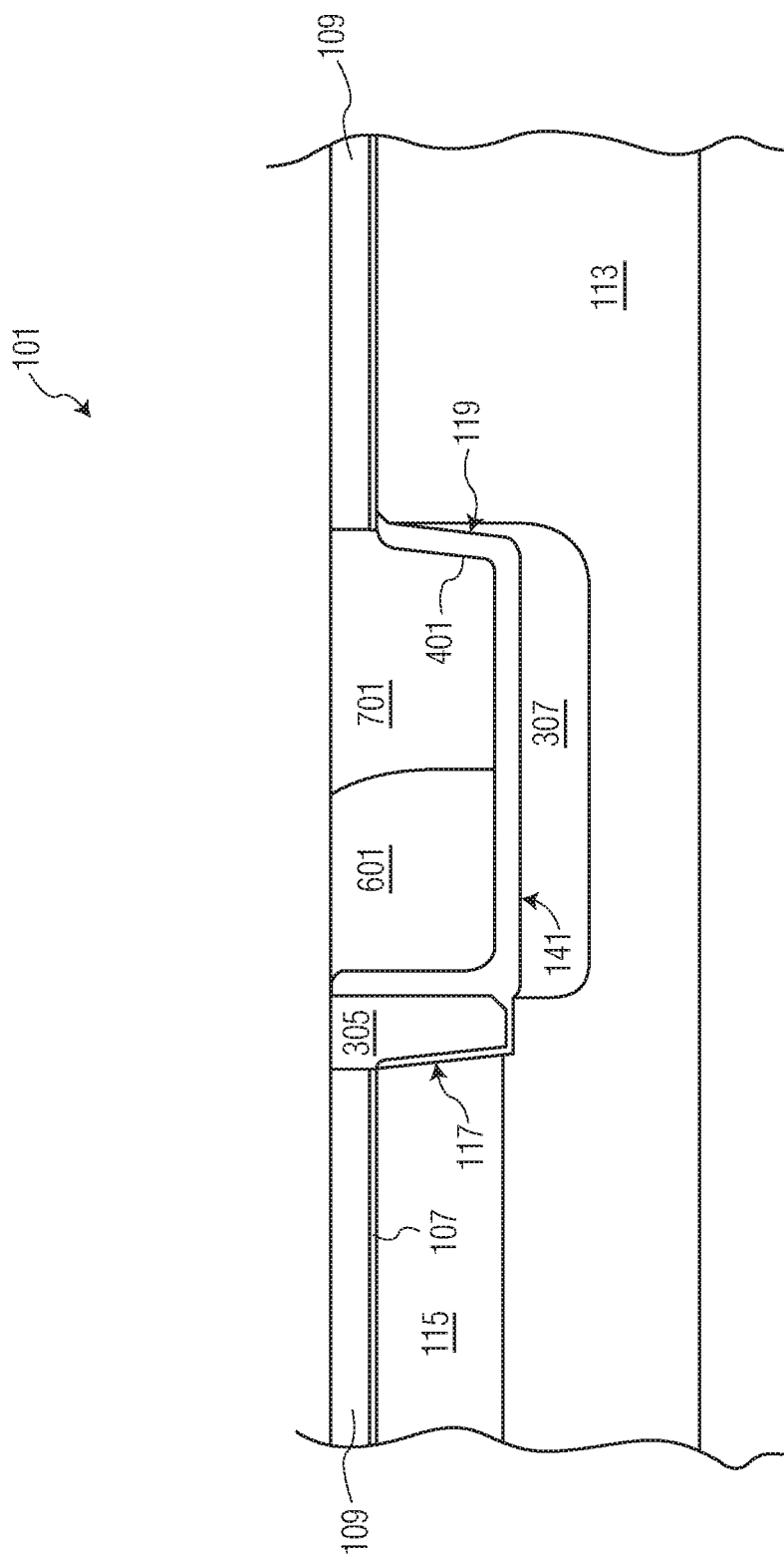

FIG. 7 is a partial cutaway side view of wafer 101 after wafer 101 has been planarized down to nitride layer 109. In one embodiment, wafer 101 is planarized by a CMP process, but may be planarized by other mechanisms in other embodiments. As shown in FIG. 7, planarization removes a top portion of spacer structure 601.

In the embodiment shown, because top surface 503 of layer 501 is higher than top surface 505 by at least the depth of trench 123 (see FIG. 5), spacer structure 601 is exposed after then planarization of wafer 101 as shown in FIG. 7.

Prior to the planarization of wafer 101, a dielectric layer (not shown) is deposited over wafer 101 to fill trench 123. In one embodiment, the dielectric layer is formed by a TEOS process. In the embodiment shown, the planarization removes the portion of the dielectric layer outside of trench 123 in the view of FIG. 7 to form dielectric structure 701.

Figure 8:
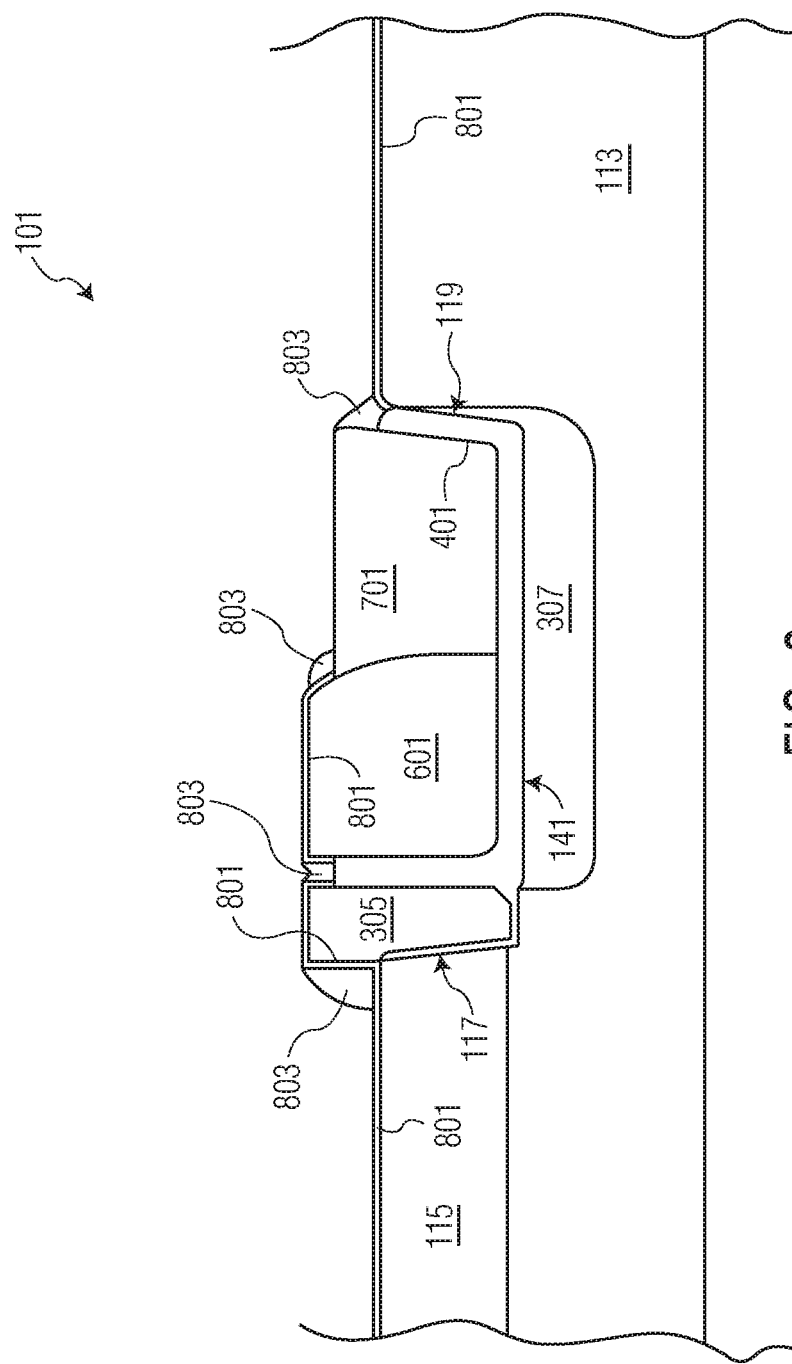

FIG. 8 shows a partial cutaway side view of wafer 101 after nitride layer 109 has been stripped with a nitride etch, after oxide layer 107 has been stripped with an oxide etch, and a thin layer 801 of oxide is formed on the exposed silicon surfaces (substrate 103, gate structure 305, spacer structure 601) of wafer 101. In one embodiment, layer 801 is formed by an oxidation process and has a thickness of 50 Angstroms, but may be formed by other methods (e.g. deposition), have other thicknesses, and/or be of other dielectric materials in other embodiments.

After layer 801 if formed, nitride spacers 803 are formed on wafer 101 to provide dielectric separation between the conductive structures of wafer 101. In one embodiment, nitride spacers 803 are formed from a layer of nitride having a thickness similar to layer 109 which may be 0.1 microns that is subsequently anisotropically etched to form spacers 803. In another embodiment, top surfaces of structures 305 and 601 may be recessed below the substrate top surface level such that spacers 803 would form at the trench sidewall above structures 305 and 601.

Figure 9:
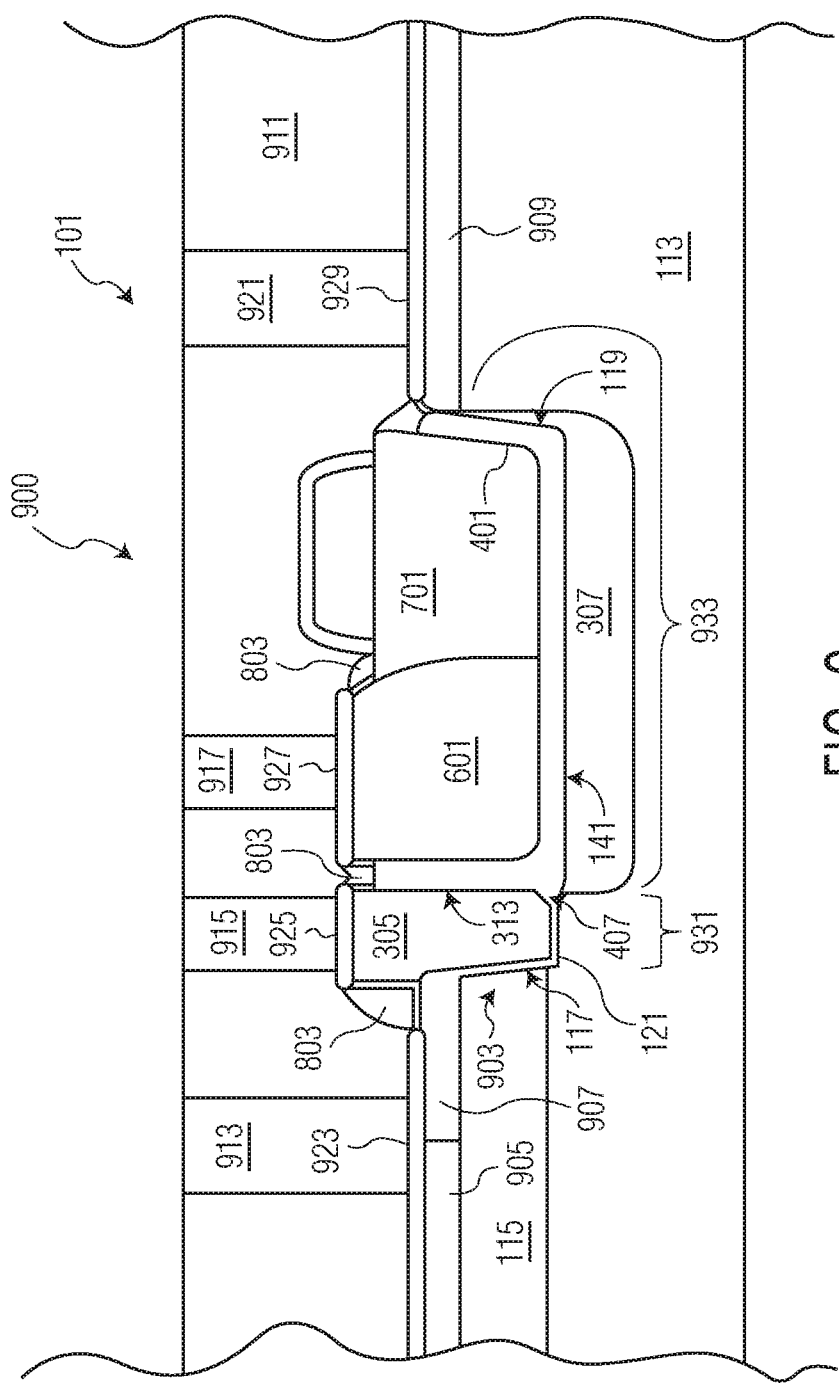

FIG. 9 shows a partial cutaway side view of wafer 101 after subsequent steps are performed to form transistor 900. N-type dopants are selectively implanted into substrate 103 through in an implant mask (not shown) to form source region 907 and drain region 909 for transistor 900. In one embodiment, regions 907 and 909 are implanted with N-type dopants such as phosphorous or arsenic at a concentration of 2e15 cm$^{-2}$ and at an energy of 40 keV. But may be implanted at other concentrations and/or other energies in other embodiments.

In one embodiment, P-type dopants are implanted through another implant mask (not shown) to form body contact region 905. In one embodiment, region 905 is formed by selectively implanting through a mask, boron ions at a dose of 1.5e15 cm$^{-2}$ and at an energy of at 20 keV into well region 115, respectively. Implantation is followed by an annealing step, e.g. rapid thermal annealing (RTA). Other P-type dopants may be implanted at other doses and/or at other energies in other embodiments. In the embodiment shown, the body contact region 905 is formed immediately adjacent to the source region 907. However, in other embodiments, the body contact region and source region may be laterally separated.

After the implantations to form regions 905, 907, and 909, layer 801 is removed (e.g. with an isotropic etch), and silicide structures (e.g. TiSi2 or CoSi2) are formed on exposed silicon surfaces. Electrical separation of silicide structures 923, 925, 927, and 929 is ensured by spacers 803 or a sufficiently thick oxide separation. Silicide structures may be formed by different methods in other embodiments.

A layer 911 of dielectric material is then formed over wafer 101. In one embodiment, layer 911 is an oxide layer form by a TEOS process. Openings are then formed in layer 911. Contacts (e.g. tungsten plugs) are formed in the openings to electrically contact the silicide structures. Contact 913 electrically contacts silicide structure 923 which contacts body contact region 905 and source region 907. Contact 915 electrically contacts silicide structure 925 which contacts gate structure 305. Contact 917 electrically contacts silicide structure 927 which contacts field plate structure 601. Contact 921 electrically contacts silicide structure 929 which contacts drain region 909. In some embodiments, the contact for a gate structure (e.g. 305) for a transistor (900) may also be the contact for field plate structure (e.g. 601). In other embodiments, contacts 915 and 917 maybe electrically tied together at a higher level interconnect level (not shown) such that gate structure 305 and spacer structure 601 are biased together. In other embodiments, the gate structure (305) and field plate structure (601) may be biased at different voltages.

As shown in FIG. 9, transistor 900 includes source region 907, a channel region 903 located in P-well region 115 along sidewall 117, drain region 909, and an extended drain region which includes an accumulation region 931 (located beneath gate structure 303) and a drift region 933 which extends from accumulation region 931 to drain region 909. Drift region 933 includes portions of doped drift region 307.

After the stage shown in FIG. 9, other processes may be performed on wafer 101 such as forming additional interconnect layers. Afterwards, external terminals e.g. bond pads are formed on wafer 101. Wafer 101 is then singulated into multiple die where each die includes a transistor similar to transistor 900. Afterwards, the die are packaged in semiconductor packaging material to form integrated circuit packages where they are shipped to end use manufacturers to include in end use products such as automobiles, battery control systems, power supplies, communication devices, and industrial equipment. In other embodiments, a transistor device may include other structures and/or may be formed by other processes. Furthermore, additional process steps may be added to form other components on the same die.

Figure 10:
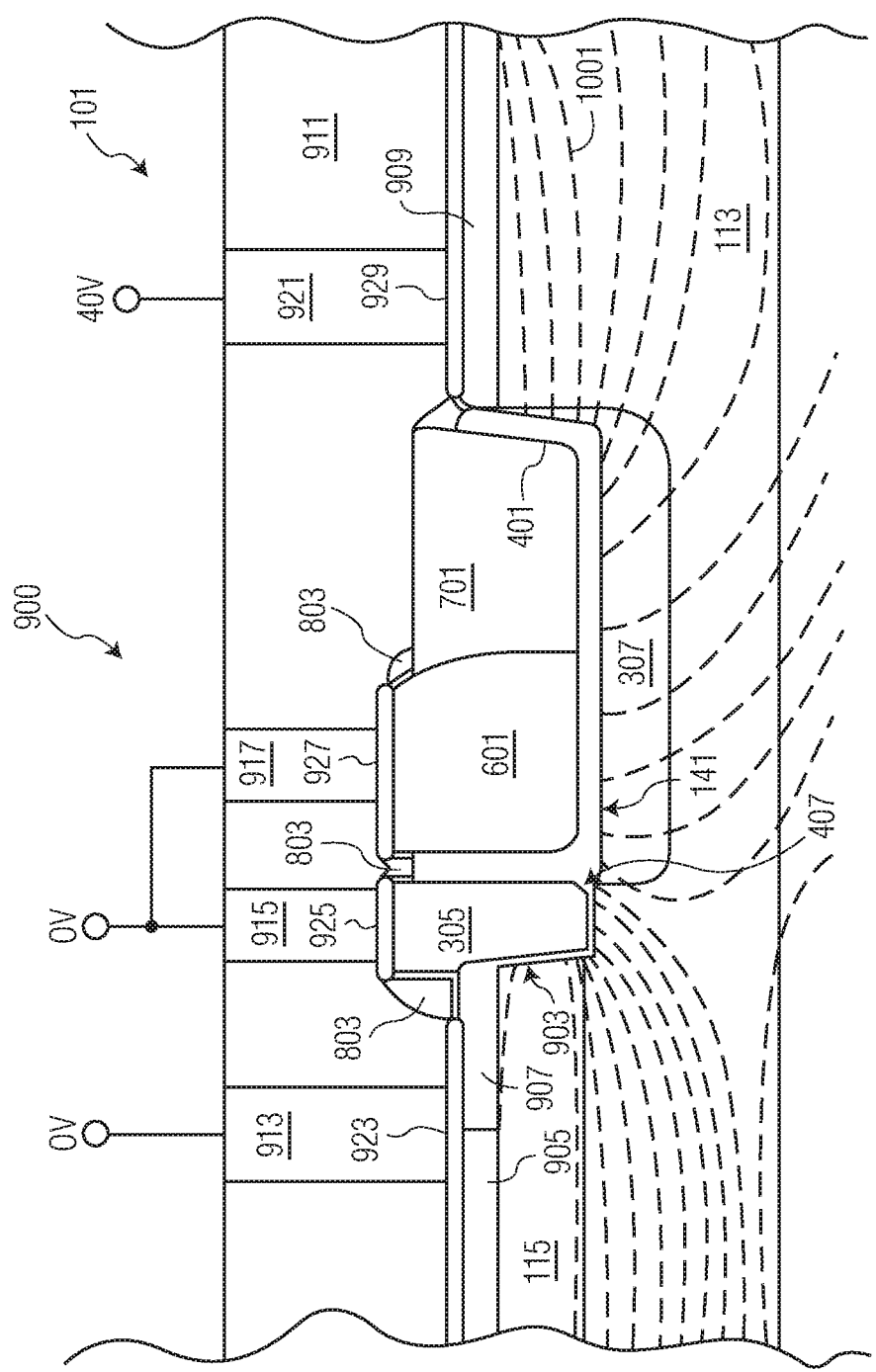
FIG. 10 is a partial side view illustration showing potential fields and the electrical coupling of a transistor device during an operating condition according to one embodiment of the present invention.

FIG. 10 shows a partial cross-sectional side view of transistor 900 during an off-state mode of operation according to one embodiment. In the embodiment shown, gate structure 303, field plate structure 601, source region 907, and body contact region 905 are each grounded (0 V). 40 Volts is applied to drain region 909.

FIG. 10 shows the equipotential lines 1001 representing the electrostatic fields of transistor 900 that occur in substrate 103 during the above described condition. As can be shown in FIG. 10, the electrostatic potential between the higher drain voltage (40 V) and the lower source voltage (ground) is distributed in the drain extension region that extends from the drain region 909 to the P well region 115. In one embodiment, the amount of voltage sustained by transistor 900 is dependent upon the width of trench 123, the depth of trench 123, the width of structures 305 and 601, the depth and doping concentration of the P well region 115, trench 123, region 307, and the depth of drain region 909 with respect to the depth of trench 123. In one embodiment, the breakdown voltage of transistor 900 is in the range of 10V to 150V, but may be of other voltages in other embodiments. Not shown are the equipotential lines in structure 701 located in trench 123.

Having the channel region 903 and a portion of the drift region 933 be vertical allows for a reduction in area of the die over a planar transistor. Having a portion of the drift region 933 be horizontal allows for a transistor to be easily scalable for adjusting the breakdown voltage by increasing or decreasing the width of trench 123. In some embodiments, the length of channel region 903 can be adjusted by varying the depth of the P-well region 115 and/or the source region 907.

In the embodiment of FIG. 10, gate structure 305 and field plate structure 601 are electrically tied together (e.g. by interconnects (not shown) located above layer 911). However, in other embodiments, gate structure 305 and field plate structure 601 would not be electrically tied together. In one embodiment, field plate structure 601 would be electrically tied to source region 907/body contact region 905. One advantage that may occur with the process shown in FIGS. 1-9 is that gate structure 305 and field plate structure 601 can be separately biased.

In some embodiments, providing a bird's beak of oxide (407) under an edge of the gate structure 305 may allow for relaxed electric fields at locations directly below the bird's beak structure.

In some embodiments, forming a field plate sidewall spacer structure using a masking layer to provide a sidewall that is higher than an opposing sidewall (as shown in FIG. 5) may allow for a method where a field plate can be implemented with a sidewall spacer along one sidewall (e.g. 313) where a sidewall spacer is not formed along the other sidewall (119). Such a method may be advantages especially where the drain region is formed along the upper portion of the opposing sidewall (as shown in FIG. 9). Such a method may allow for sidewall spacer field plate to be formed for a vertical transistor without an extra masking step to remove the opposing sidewall spacer structure formed along the sidewall of the drain region.

Another advantage that may occur with some embodiments described herein is that the dielectric vertical separation between the gate structure 305 and the bottom surface level 141 of the trench 123 (as defined by the thickness of layer 121) can be separately controlled from the dielectric vertical separation between the field plate structure 601 and the bottom surface level 141 of trench 123 (as defined by the thickness of layer 401). The dielectric vertical separations can be separately controlled to achieve desired transistor characteristics.

Figure 11:
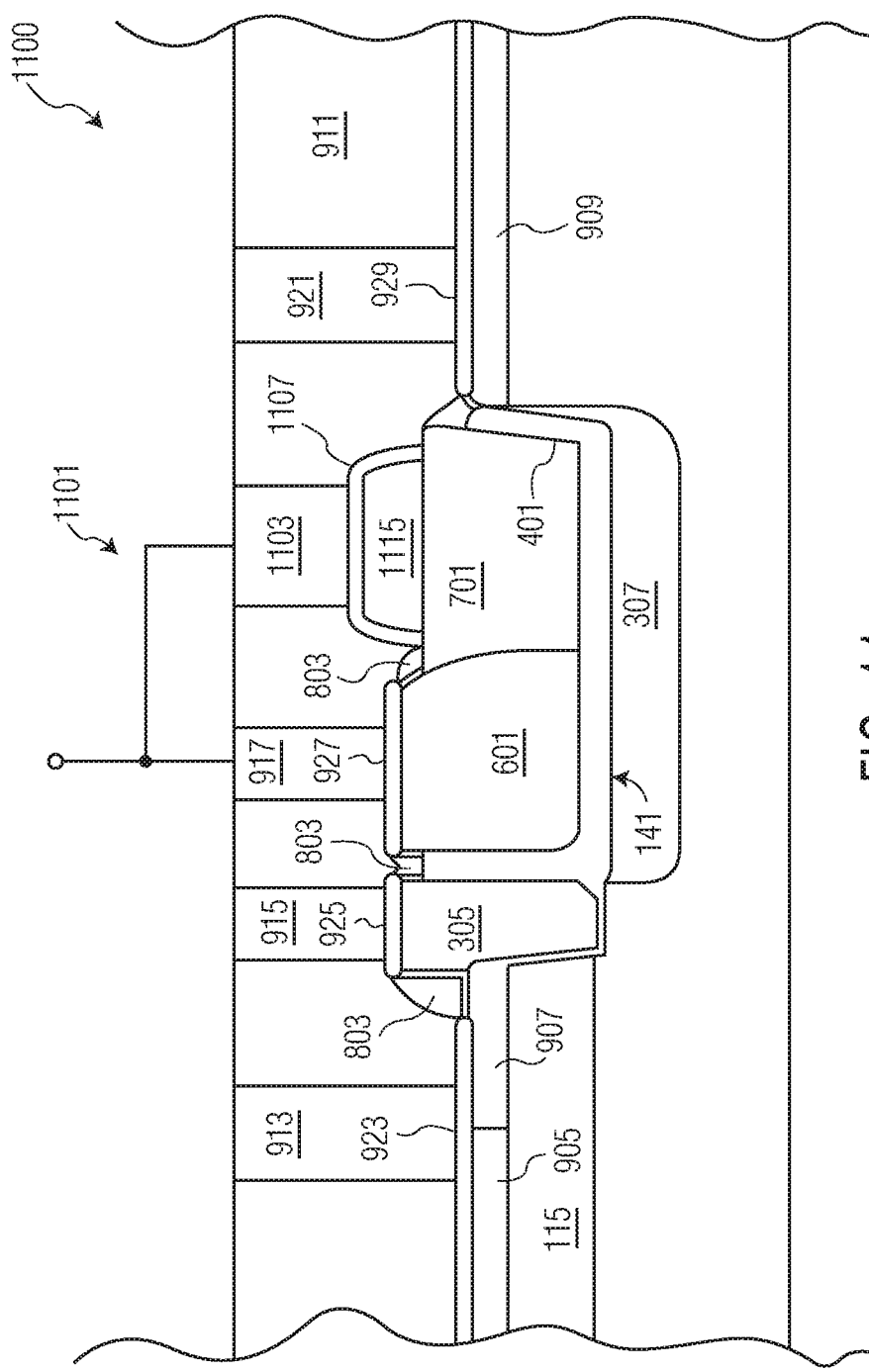
FIG. 11 sets forth a partial cutaway side view of a stage in the manufacture of a transistor device according to another embodiment of the present invention.

FIG. 11 shows a partial cutaway side view of wafer 1100 that includes a transistor 1101 according to another embodiment of the present invention. In the embodiment shown, wafer 1100 is similar to wafer 101, with the structures in FIG. 11 being similar to the structures in FIG. 9 that have the same identification numbers.

In the embodiment of FIG. 11, transistor 1101 includes an additional conductive field plate structure 1115 that is formed over structure 701. In one embodiment, structure 1115 is lithographically defined where a layer of conductive material (not shown) is etched as per a lithographically defined mask. In one embodiment, structure 1115 is formed from a layer of polysilicon that is used to form gate structures of planar transistors (not shown) at other locations of wafer 1100. Structure 1115 is electrically coupled to contact 1103 (through silicide 1107) which is electrically coupled to contact 917 to be biased at the same voltage during operation.

In some embodiments, providing an additional field plate structure (1115) allows for a transistor to handle higher voltage differentials and thereby increase the breakdown voltage of the transistor. In some embodiments, the additional field plate structure (1115) can be connected to the source contact (913), which may help in some embodiments, in lowering the capacitive coupling ($C_{gd}$) between gate and drain. Such a configuration may be beneficial in improving the Switching Time (Turn-On/Turn-Off Time).

Figure 12:
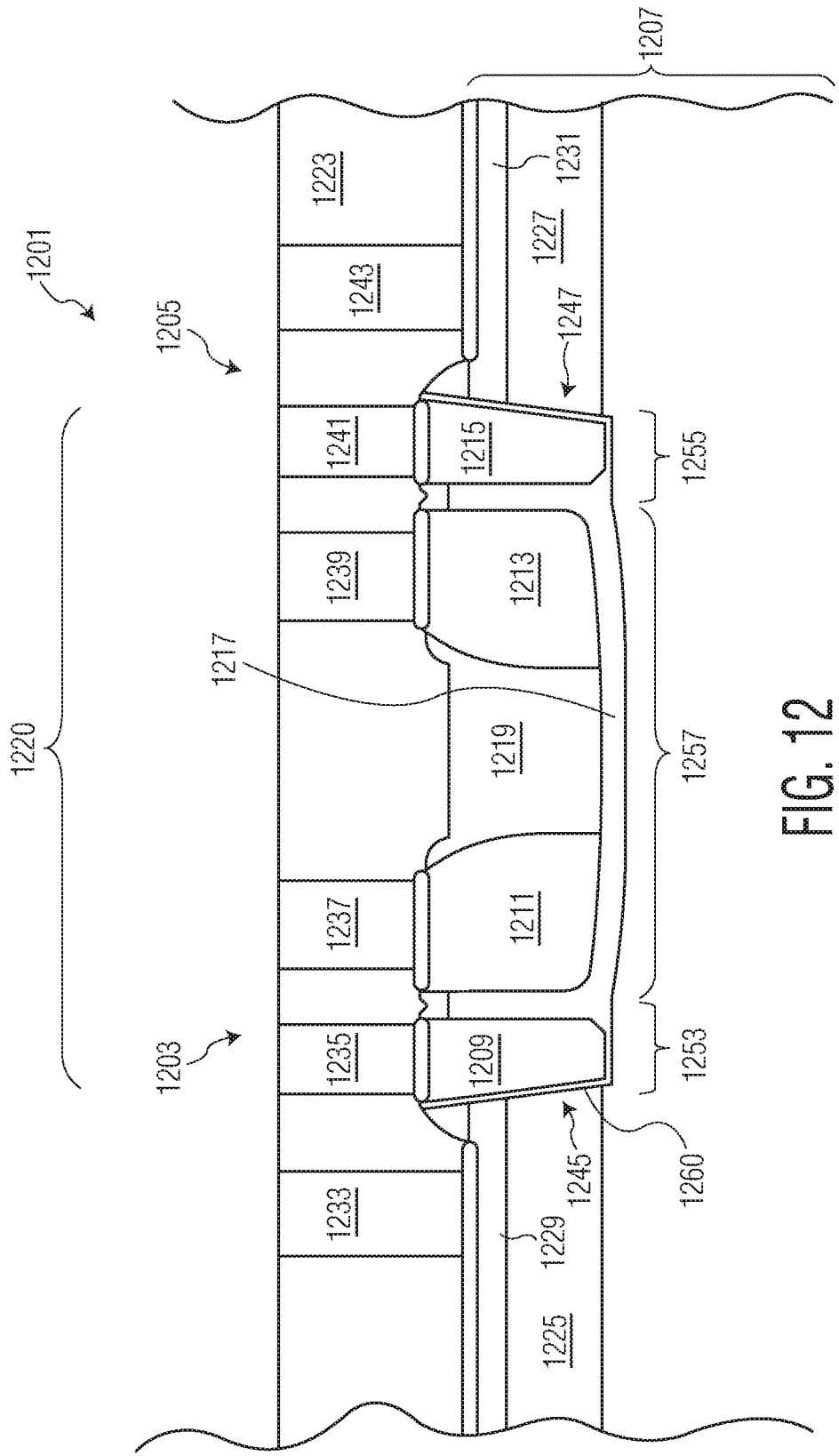
FIG. 12 sets forth a partial cutaway side view of a stage in the manufacture of a transistor device according to another embodiment of the present invention.

FIG. 12 shows a partial cutaway side view of wafer 1201 that includes a transistor device according to another embodiment of the present invention. Wafer 1201 includes transistors 1203 and 1205 which include structures implemented in a semiconductor substrate 1207. Transistor 1203 includes an N-type source region 1229, a channel region 1245 located in P well region 1225, a gate structure 1209, and a field plate structure 1211. Transistor 1205 includes an N-type source region 1231, a channel region 1247 located in P well region 1227, a gate structure 1215, and a field plate structure 1213. Gate contact 1235 is electrically coupled to gate structure 1209 and gate contact 1241 is electrically coupled to gate structure 1215. Source contact 1233 is electrically coupled to source region 1229 and source contact 1243 is electrically coupled to source region 1231. Field plate contact 1237 is electrically coupled to field plate structure 1211 and field plate contact 1239 is electrically coupled to field plate structure 1213. The contacts are located in dielectric layer 1223. Dielectric structure 1219 separate field plate structures 1211 and 1213. Transistors 1203 and 1205 include a gate dielectric layer 1260. In the embodiment shown, the body contact regions (not shown) are located outside the view of FIG. 12, but they may be located immediately adjacent to the source regions in other in other embodiments.

In one embodiment, gate structures 1209 and 1215 are formed in a similar manner to the formation of gate structure 305 and field plate structures 1211 and 1213 are formed in a similar manner as field plate structure 601, except in the view of FIG. 3, a gate structure (not shown) would be formed adjacent to sidewall 119 similar to gate structure 305 being formed adjacent to sidewall 117. With the embodiment of FIG. 12, two opposite field plate side wall structures 1211 and 1213 are formed in the trench from a layer (similar to layer 501) instead of one sidewall field plate structure (601, see FIG. 6) as formed from layer 501 in trench 123. Accordingly, with the embodiment of FIG. 12, two field plate spacer structures (1211 and 1213) similar to spacer structure 601 are formed in trench 1220 adjacent to two gate structures (1209 and 1215). Unlike the view of FIG. 5, there is no height differential distance (512) between the top surfaces of field plate material layer (501) on each side of the trench.

The device shown in FIG. 12 is a back-to-back bidirectional transistor device that includes transistors 1203 and 1205 coupled in a back-to-back configuration. The bidirectional transistor device can be implemented as a bidirectional switch. A bidirectional transistor device is a device that can selectively block voltages in both directions and conduct current in both directions. The drain region for both transistors 1203 and 1205 is characterized as a "virtual drain" in that it is not biased at a particular voltage with a direct external contact and it is an internal node of a bi-directional device. In the embodiment shown, a virtual extended drain region located in N type region 1222 extends from P well region 1225 to P well region 1227. The virtual extended drain region includes an accumulation region 1253 for transistor 1203, an accumulation region 1255 for transistor 1205, and a shared virtual drift region 1257.

In one embodiment, a circuit of transistors 1203 and 1205 can be utilized as a switch between a node connected to source contact 1233 and a node connected to the source contact 1243, regardless of which node is at the higher voltage.

In other embodiments, transistors 1203 and 1205 may include a shared drain region (not shown) located below the bottom portion of trench below dielectric structure 1219. In such an embodiment, and opening (not shown) would be formed in dielectric structure 1219 wherein N-type dopants would be implanted into region 1222 to form a shared drain region. A contact (not shown) would be formed in the opening to bias the shared drain region.

In other embodiments, a transistor may include multiple sidewall spacer field plate structures each formed after the other. For example, in some embodiments, after the view of FIG. 6, a second dielectric layer (not shown) may be formed on spacer structure 601 and a second field plate spacer structure (not shown) may be formed in trench 123. In such an embodiment, the second field plate spacer structure may be planarized along with structure 601 (see FIG. 7).

In other embodiments, the transistors may have other configurations, other structures, be of other types of transistors, and/or be formed by other methods. For example, although the transistors described above are NFETs, the processes shown and described above can be used to make PFETs as well by switching the net conductivity type of at least some of the semiconductor regions. The processes descried above may also be used to make other types of transistors in other embodiments.

As disclosed herein, a first structure is "directly over" a second structure if the first structure is located over the second structure in a line having a direction that is perpendicular with the generally planar major side of a wafer. For example, in FIG. 9, contact 921 is directly over drain region 909. Contact 917 is not directly over drain region 909. As disclosed herein, a first structure is "directly beneath" a second structure if the first structure is located beneath the second structure in a line having a direction that is perpendicular with the generally planar major side of the wafer. For example, in FIG. 9, region 307 is directly beneath contact 917. Region 307 is not directly beneath contact 913. One structure is "directly between" two other structures in a line if the two structures are located on opposite sides of the one structure in the line. For example, in FIG. 9, structure 601 is located directly between structure 305 and structure 701 in a line in the cut away side view of FIG. 9. Contact 917 is not located directly between region 907 and region 909 in a line. "Directly laterally between" means that the line is a lateral line. A "lateral line" is a line that is parallel with a generally planar major side of the wafer. In FIG. 9, regions 907 and 909 are located in a lateral line. Region 907 and silicide structure 927 are not located in a lateral line. As disclosed herein, a first structure is "laterally separated" from a second structure if there is separation between the two structures in a line that is parallel with a generally planar major side of the wafer. For example, in FIG. 9, region 905 and region 909 are laterally separated from each other. As disclosed herein, a "lateral distance" is the distance in a direction that is parallel with a generally planar major side of the wafer. As disclosed herein, a "vertical distance" is the distance in a direction that is perpendicular with a generally planar major side of the wafer. A "vertical component sidewall" of a trench is a portion of a trench sidewall having a profile that overall, the majority component of the portion is vertical even though it may also have a horizontal component or that it may have minor horizontal discontinuity at an interior location of the sidewall portion. For example, a portion of a sidewall sloped at 70 degrees may be considered a vertical component sidewall portion. A sidewall spacer structure is a structure defined by its self-aligned spacing from a sidewall and is not photo lithographically defined. As disclosed herein, a sidewall spacer structure formed or located along a sidewall includes where the spacer structure is in contact with the sidewall or where the spacer structure is formed in contact with an intervening layer or layers between the spacer and the sidewall.

Features shown or described herein with respect to one embodiment may be implemented in other embodiments shown or described herein.

In one embodiment, a transistor device includes a source region for a transistor located in a first portion of a semiconductor material. The first portion has an upper surface at a first level. A second portion of the semiconductor material has an upper surface at a second level that is lower than the first level. A vertical component sidewall of the semiconductor material separates the first portion from the second portion. The transistor device includes a control terminal structure for the transistor laterally adjacent to the vertical component sidewall and located directly over the second portion. The control terminal structure is vertically separated from the second portion by dielectric by a first vertical distance. The transistor device includes a field plate sidewall spacer structure for the transistor laterally adjacent to the vertical component sidewall and to the control terminal structure. The field plate sidewall spacer structure is located directly over the second portion. The field plate sidewall spacer structure is vertically separated from the second portion by dielectric by a second vertical distance. The second vertical distance is greater than the first vertical distance. The transistor device includes a channel region for the transistor including a portion located along the vertical component sidewall laterally adjacent to the control terminal structure and below the source region. The transistor device includes an extended drain region for the transistor. The extended drain region includes a portion located directly below the field plate sidewall spacer structure in the second portion.

In another embodiment, a method for forming a transistor device includes forming a trench in a semiconductor material of a wafer. The trench being defined by a first vertical component sidewall of the semiconductor material, a second vertical component sidewall of the semiconductor material, and a lower level surface of the semiconductor material. The method includes forming a layer of control terminal material in the trench and patterning the layer of control terminal material to form a vertical component sidewall of the control terminal material in the trench. The vertical component sidewall of the control terminal material facing the second vertical component sidewall of the semiconductor material. The method includes forming a dielectric layer directly over the lower level surface. The dielectric layer including a portion located along the vertical component sidewall of the control terminal material. The method includes forming a conductive sidewall spacer structure laterally adjacent to and along the vertical component sidewall of the control terminal material and directly over the portion of the dielectric layer and directly over the lower level surface, wherein the conductive sidewall spacer structure is utilized as a field plate for a transistor. The method includes forming a source region for the transistor in the semiconductor material. The source region including a portion located along the first vertical component sidewall located directly above a portion of a channel region for the transistor in the semiconductor material located along the first vertical component sidewall. The transistor includes an extended drain region in the semiconductor material including at least a portion located directly below the conductive sidewall spacer structure along the first vertical component sidewall.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor device comprising:
   forming a trench in a semiconductor material of a wafer, the trench being defined by a first vertical component sidewall of the semiconductor material, a second vertical component sidewall of the semiconductor material, and a lower level surface of the semiconductor material;
   forming a layer of control terminal material in the trench;
   patterning the layer of control terminal material to form a vertical component sidewall of the control terminal material in the trench, the vertical component sidewall of the control terminal material facing the second vertical component sidewall of the semiconductor material;
   forming a dielectric layer directly over the lower level surface, the dielectric layer including a portion located along the vertical component sidewall of the control terminal material;
   forming a conductive sidewall spacer structure laterally adjacent to and along the vertical component sidewall of the control terminal material and directly over the portion of the dielectric layer and directly over the lower level surface, wherein the conductive sidewall spacer structure is utilized as a field plate for a transistor;
   forming a source region for the transistor in the semiconductor material, the source region including a portion located along the first vertical component sidewall located directly above a portion of a channel region for the transistor in the semiconductor material located along the first vertical component sidewall;
   wherein the transistor includes an extended drain region in the semiconductor material including at least a portion located directly below the conductive sidewall spacer structure along the first vertical component sidewall.

2. The method of claim 1 wherein the forming the dielectric layer over the lower level surface includes utilizing a LOCOS process to form an oxide material.

3. The method of claim 1 wherein the forming the conductive sidewall spacer structure includes planarizing the wafer to remove a top portion of the conductive sidewall spacer structure.

4. The method of claim 3 wherein after the planarizing, forming a field plate structure for the transistor, the field plate structure is located in an area of the wafer that is laterally between an area of a control terminal structure for the transistor and an area of a drain region for the transistor, the field plate structure includes a portion located directly over the lower level surface of the semiconductor material.

5. The method of claim 4 wherein the forming the field plate structure includes forming a layer of conductive material over the wafer and then patterning the layer of conductive material to define the field plate structure.

6. The method of claim 1 wherein the patterning the layer of control terminal material to form the vertical component sidewall of the control terminal material in the trench includes patterning a mask material layer located directly above the layer of control terminal material to form a vertical component sidewall of the mask material layer aligned with the vertical component sidewall of control terminal material, wherein the patterning removes the layer of control terminal material from over the second vertical component sidewall.

7. The method of claim 1 wherein the forming the conductive sidewall spacer structure includes forming a layer of conductive sidewall spacer material over the wafer and anisotropically etching the layer of the conductive sidewall spacer material, wherein as a result of the anisotropically etching, no conductive sidewall spacer remains located along the second vertical component sidewall of the semiconductor material.

8. The method of claim 7 wherein prior to anisotropically etching the conductive sidewall spacer material, a top surface of the layer of conductive sidewall spacer material located directly over the vertical component sidewall of the control terminal material is higher than a top surface of the layer of conductive sidewall spacer material located directly over the second vertical component sidewall.

9. The method of claim 8 wherein a difference in height between the top surface of the layer of conductive sidewall spacer material located directly over the vertical component sidewall of the control terminal material and the top surface of the layer of conductive sidewall spacer material located directly over the second vertical component sidewall is greater than a depth of the trench in the semiconductor material.

10. The method of claim 1 further comprising:
wherein the second vertical component sidewall of the semiconductor material separating a second upper surface level and the lower level surface of the semiconductor material, the second vertical component sidewall of the semiconductor material facing the first vertical component sidewall of the semiconductor material;
wherein the patterning the layer of control terminal material includes patterning the layer of control terminal material to form a second vertical component sidewall of the control terminal material in the trench, the second vertical component sidewall of the control terminal material facing the vertical component sidewall of control terminal material;
wherein the dielectric layer including a portion located along the second vertical component sidewall of the control terminal material;
the method further includes forming a second conductive sidewall spacer structure laterally adjacent to and along the second vertical component sidewall of the control terminal material and directly over the portion of the dielectric layer and directly over the lower surface level, wherein the second conductive sidewall spacer structure is utilized as a field plate for a second transistor;
forming a second source region for the second transistor in the semiconductor material, the second source region including a portion located along the second vertical component sidewall located directly above a portion of a second channel region for the second transistor in the semiconductor material located along the second vertical component sidewall;
wherein the second transistor includes a second extended drain region including at least a portion located directly below the second conductive sidewall spacer structure.

11. The method of claim 10 wherein the extended drain region and the second extended drain region are characterized as virtual extended drain regions, wherein the transistor and the second transistor are coupled in a back-to-back configuration.

* * * * *